(12) United States Patent
Lewis et al.

(10) Patent No.: US 7,869,977 B2
(45) Date of Patent: Jan. 11, 2011

(54) USING MULTIPLE ANTENNAS TO CHARACTERIZE A COMPUTER SYSTEM BASED ON ELECTROMAGNETIC SIGNALS

(75) Inventors: Andrew J Lewis, Litchfield, NH (US); Ramakrishna C. Dhanekula, San Diego, CA (US); Kenny C. Gross, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 287 days.

(21) Appl. No.: 12/188,998

(22) Filed: Aug. 8, 2008

(65) Prior Publication Data

US 2010/0033386 A1    Feb. 11, 2010

(51) Int. Cl.
    *G06F 19/00*    (2006.01)
(52) U.S. Cl. ............... 702/182; 324/501; 324/750; 702/187; 702/189
(58) Field of Classification Search ............ 324/500, 324/501, 537, 750; 702/1, 33, 35, 38, 57, 702/64, 65, 66, 108, 117, 127, 182, 183, 702/185, 187, 189
    See application file for complete search history.

(56) References Cited

U.S. PATENT DOCUMENTS

| | | | | |
|---|---|---|---|---|
| 3,082,374 A | * | 3/1963 | Buuck | 324/73.1 |
| 7,020,802 B2 | * | 3/2006 | Gross et al. | 714/39 |
| 7,188,037 B2 | * | 3/2007 | Hidehira | 702/58 |
| 7,613,576 B2 | * | 11/2009 | Gross et al. | 702/57 |
| 7,613,580 B2 | * | 11/2009 | Gross et al. | 702/89 |
| 2002/0033706 A1 | * | 3/2002 | Khazei | 324/750 |
| 2002/0095304 A1 | * | 7/2002 | Khazei | 705/1 |
| 2008/0252309 A1 | * | 10/2008 | Gross et al. | 324/750 |
| 2008/0256398 A1 | * | 10/2008 | Gross et al. | 714/47 |
| 2009/0099830 A1 | * | 4/2009 | Gross et al. | 703/14 |
| 2009/0125467 A1 | * | 5/2009 | Dhanekula et al. | 706/20 |
| 2009/0150324 A1 | * | 6/2009 | Dhanekula et al. | 702/57 |
| 2009/0292490 A1 | * | 11/2009 | McElfresh et al. | 702/66 |
| 2009/0306920 A1 | * | 12/2009 | Zwinger et al. | 702/77 |
| 2010/0023282 A1 | * | 1/2010 | Lewis et al. | 702/57 |
| 2010/0161525 A1 | * | 6/2010 | Gross et al. | 706/12 |

* cited by examiner

*Primary Examiner*—Edward R Cosimano
(74) *Attorney, Agent, or Firm*—Park, Vaughan, Fleming & Dowler LLP (57) ABSTRACT

Some embodiments of the present invention provide a system that characterizes a computer system parameter by analyzing a target electromagnetic signal radiating from the computer system. First, the target electromagnetic signal is monitored using a first antenna and a second antenna, wherein an axis of the second antenna is oriented non-parallel to an axis of the first antenna. Then, the target electromagnetic signal received from the first antenna and the target electromagnetic signal received from the second antenna are separately analyzed to characterize the computer system parameter.

20 Claims, 9 Drawing Sheets

USING MULTIPLE ANTENNAS TO CHARACTERIZE A COMPUTER SYSTEM BASED ON ELECTROMAGNETIC SIGNALS

BACKGROUND

1. Field

The present invention generally relates to techniques for monitoring a computer system. More specifically, the present invention relates to a method and an apparatus that characterizes a computer system parameter by analyzing a target electromagnetic signal radiating from the computer system.

2. Related Art

Electromagnetic signals radiated by computer systems can be used to characterize parameters of the computer system. However, these electromagnetic signals may be polarized, which can cause the signal received by an antenna to be very sensitive to the orientation of the antenna. In many situations, this orientation-based sensitivity can limit the ability to use the received signal to characterize computer system parameters.

Hence, what is needed is a method and system that characterizes a computer system parameter by analyzing a target electromagnetic signal radiating from the computer system without the above-described problems.

SUMMARY

Some embodiments of the present invention provide a system that characterizes a computer system parameter by analyzing a target electromagnetic signal radiating from the computer system. First, the target electromagnetic signal is monitored using a first antenna and a second antenna, wherein an axis of the second antenna is oriented non-parallel to an axis of the first antenna. Then, the target electromagnetic signal received from the first antenna and the target electromagnetic signal received from the second antenna are separately analyzed to characterize the computer system parameter.

In some embodiments, the first antenna is orthogonal to the second antenna.

Some embodiments further monitor the target electromagnetic signal using a third antenna, wherein the third antenna is orthogonal to the first antenna and the second antenna. In these embodiments, the target electromagnetic signal received from the first antenna, the target electromagnetic signal received from the second antenna, and the target electromagnetic signal received from the third antenna are separately analyzed to characterize the computer system parameter.

In some embodiments, prior to monitoring the target electromagnetic signal using the first antenna and the second antenna, a reference electromagnetic signal radiating from the computer system is monitored using a first reference antenna and a second reference antenna, wherein an axis of the second reference antenna is oriented non-parallel to an axis of the first reference antenna. Then, a first reference model is generated to characterize the computer system parameter based on the reference electromagnetic signal monitored using the first reference antenna. Similarly, a second reference model is generated to characterize the computer system parameter based on the reference electromagnetic signal monitored using the second reference antenna.

In some embodiments, at least one of the first reference model and the second reference model uses a pattern-recognition technique.

In some embodiments, at least one of the first reference model and the second reference model uses a multivariate state estimation technique (MSET).

In some embodiments, the first reference antenna includes the first antenna, and the second reference antenna includes the second antenna.

In some embodiments, separately analyzing the target electromagnetic signal received from the first antenna and the target electromagnetic signal received from the second antenna includes generating a first target electromagnetic-signal fingerprint from the target electromagnetic signal monitored using the first antenna, and generating a second target electromagnetic-signal fingerprint from the target electromagnetic signal monitored using the second antenna. Then, the first target electromagnetic-signal fingerprint is fed into the first reference model to characterize the computer system parameter, and the second target electromagnetic-signal fingerprint is fed into the second reference model to characterize the computer system parameter.

In some embodiments, feeding the first target electromagnetic-signal fingerprint into the first reference model to characterize the computer system parameter includes producing a first estimated electromagnetic-signal fingerprint using the first reference model. Similarly, feeding the second target electromagnetic-signal fingerprint into the second reference model to characterize the computer system parameter includes producing a second estimated electromagnetic-signal fingerprint using the second reference model.

In some embodiments, separately analyzing the target electromagnetic signal received from the first antenna and the target electromagnetic signal received from the second antenna to characterize the computer system parameter includes comparing the first target electromagnetic-signal fingerprint to the first estimated electromagnetic fingerprint to characterize the computer system parameter, and comparing the second target electromagnetic-signal fingerprint to the second estimated electromagnetic fingerprint to characterize the computer system parameter.

In some embodiments, comparing the first target electromagnetic-signal fingerprint to the first estimated electromagnetic fingerprint includes, for each frequency in a set of frequencies from a frequency-domain representation of the first reference electromagnetic signal, first computing a first residual signal between a corresponding first monitored electromagnetic-signal amplitude-time series in the first target electromagnetic-signal fingerprint and a corresponding first estimated electromagnetic-signal amplitude-time series in the first estimated electromagnetic-signal fingerprint. Then, anomalies in the first residual signal are detected by using sequential detection, wherein the anomalies indicate a deviation of the first monitored electromagnetic-signal amplitude-time series from the first estimated electromagnetic-signal amplitude-time series.

In some embodiments, comparing the second target electromagnetic-signal fingerprint to the second estimated electromagnetic fingerprint includes computing a second residual signal between a corresponding second monitored electromagnetic-signal amplitude-time series in the second target electromagnetic-signal fingerprint and a corresponding second estimated electromagnetic-signal amplitude-time series in the second estimated electromagnetic-signal fingerprint. It also includes detecting anomalies in the second residual signal by using sequential detection, wherein the anomalies indicate a deviation of the second monitored electromagnetic-signal amplitude-time series from the second estimated electromagnetic-signal amplitude-time series. Additionally, characterizing the computer system parameter includes detecting anomalies in at least one of the first residual signal and the second residual signal.

In some embodiments, the computer system parameter includes a computer system health metric.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Figure 1:
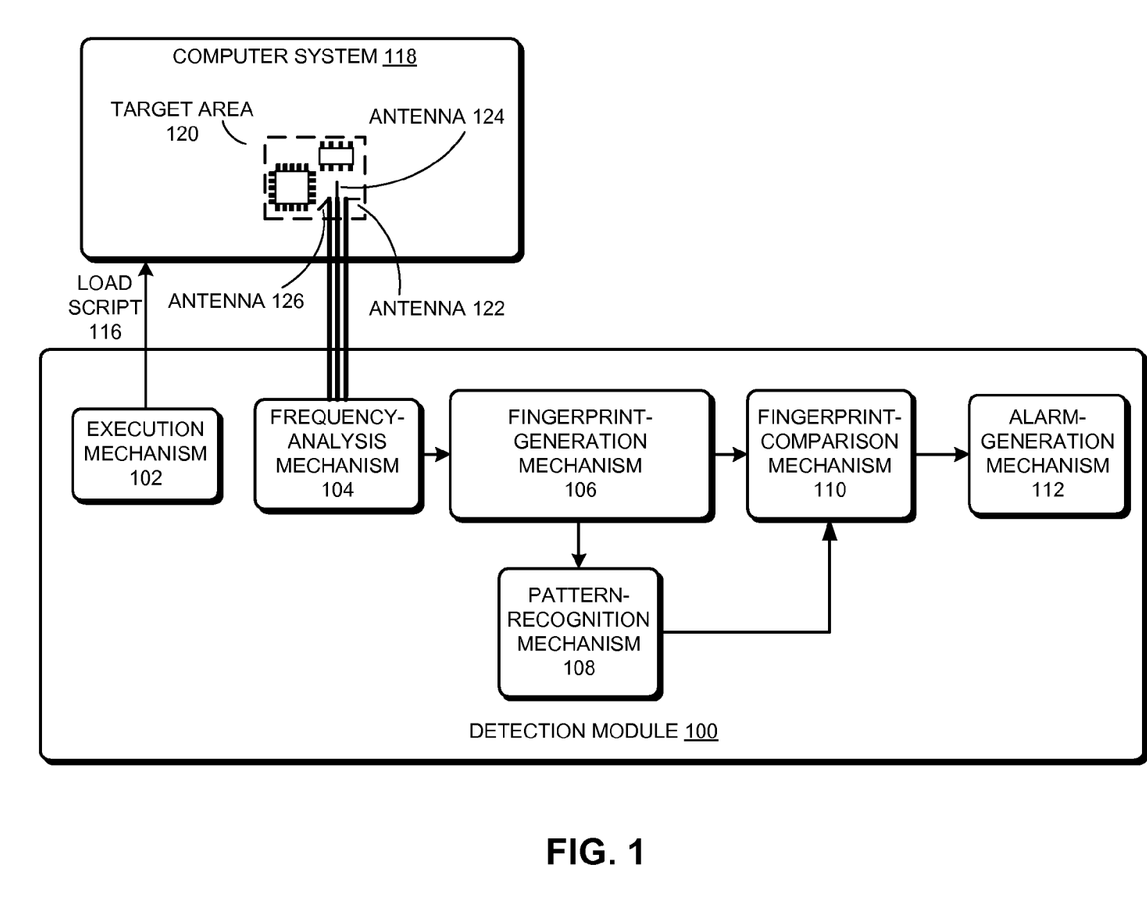
FIG. 1 illustrates a system that characterizes a computer system parameter by analyzing a target electromagnetic signal radiating from the computer system in accordance with some embodiments of the present invention.

FIG. 1 illustrates a system that characterizes a computer system parameter by analyzing a target electromagnetic signal radiating from the computer system in accordance with some embodiments of the present invention. As illustrated in FIG. 1, detection module 100 includes: execution mechanism 102, frequency-analysis mechanism 104, fingerprint-generation mechanism 106, pattern-recognition mechanism 108, fingerprint-comparison mechanism 110, and alarm-generation mechanism 112. Computer system 118 includes target area 120.

Execution mechanism 102 causes load script 116 to run on computer system 118. Frequency-analysis mechanism 104 is coupled to antenna 122, antenna 124, antenna 126 and fingerprint-generation mechanism 106. Fingerprint-generation mechanism 106 is coupled to pattern-recognition mechanism 108 and fingerprint-comparison mechanism 110. Pattern-recognition mechanism 108 is coupled to fingerprint-comparison mechanism 110, and fingerprint-comparison mechanism 110 is coupled to alarm-generation mechanism 112.

Frequency-analysis mechanism 104, fingerprint-generation mechanism 106, pattern-recognition mechanism 108, fingerprint-comparison mechanism 110, and alarm-generation mechanism 112 can each be implemented in any combination of hardware and software. In some embodiments one or more of these mechanisms operates on computer system 118. In some embodiments, one or more of these mechanisms operates on one or more service processors. In some embodiments, one or more of these mechanisms is located inside computer system 118. In some embodiments, one or more of these mechanisms operates on a separate computer system.

Computer system 118 can include but is not limited to a server, a server blade, a datacenter server, an enterprise computer, a field-replaceable unit that includes a processor, or any other computation system that includes one or more processors and one or more cores in each processor.

Target area 120 can be any area of computer system 118 that is radiating electromagnetic signals related to a computer system parameter. In some embodiments, target area 120 includes one or more chips, devices or printed circuit boards that emit electromagnetic signals related to a computer system parameter. In some embodiments, target area 120 includes all of computer system 118. In some embodiments, target area 120 includes multiple target areas in one or more computer systems.

Antenna 122, antenna 124, and antenna 126 are each coupled to frequency-analysis mechanism 104 and are positioned to receive electromagnetic signals from target area 120. Antenna 122, antenna 124, and antenna 126 are oriented perpendicular to each other. In some embodiments, antenna 122, antenna 124, and antenna 126 are configured so that they are not perpendicular to each other and so that none of the 3 antennas is parallel to any of the other 3 antennas. In some embodiments, there are only 2 antennas and they are oriented non-parallel to each other, and in some of these embodiments, the 2 antennas are perpendicular to each other. In some embodiments, each of the antennas is oriented to maximize the reception of different polarization states of the electromagnetic signal. In some embodiments, there are more than 3 antennas. In some embodiments, each antenna is oriented to maximize reception of a predetermined electromagnetic /signal radiating from target area 120

In some embodiments of the present invention, antenna 122, antenna 124, and antenna 126 can include but are not limited to: a dipole antenna, a Yagi-Uda antenna, a loop antenna, an electrical short antenna (e.g., an open-ended wire having a length less than a quarter wavelength), a fractal antenna, a parabolic antenna, a microstrip antenna, a quad antenna, a random wire antenna (e.g., an open-ended wire having a length greater than one wavelength), a beverage antenna, a helical antenna, a phased array antenna, and any other type of antenna now known or later developed.

In some embodiments of the present invention, antenna 122, antenna 124, and antenna 126 are each an insulated wire with a fixed length of the insulation stripped off. In some of these embodiments, the stripped end of the insulated wire is open to free space and the other end of the wire is coupled to frequency-analysis mechanism 104. In one embodiment of the present invention, the stripped length is approximately ½ inch. In another embodiment of the present invention, the length of the antenna can be selected to achieve optimal discrimination sensitivity and robustness. Note that while many types of antennas can be used to collect electromagnetic signals, stripped wire provides a simple and inexpensive option.

In some embodiments, antenna 122, antenna 124, and antenna 126 are placed at a fixed position inside computer system 118. In some embodiments, antenna 122, antenna 124, and antenna 126 are placed in a predetermined position in computer system 118 when the computer system is manufactured or during a post manufacture step. In some embodiments, antenna 122, antenna 124, and antenna 126 are placed in a predetermined relationship with respect to one or more components or areas inside computer system 118. For example, to receive electromagnetic signals from a processor in computer system 118, antenna 122, antenna 124, and antenna 126 can be placed near the processor and in a specified orientation with respect to the processor. The orientation of the antennas can be based on properties of the electromagnetic signals which are desired to be received, including but not limited to one or more of the following: the polarization and signal strength of the electromagnetic signals to be detected; and the polarization and strength of other electromagnetic signals generated by computer system 118 or other devices. In some embodiments, antenna 122, antenna 124, and antenna 126 are inserted into computer system 118 through an opening in the chassis. In some embodiments, antenna 122, antenna 124, and antenna 126 are moved to a predetermined number of pre-specified locations within computer system 118 and electromagnetic signals are detected at each location.

In some embodiments, antenna 122, antenna 124, and antenna 126 are placed external to computer system 118. Antenna 122, antenna 124, and antenna 126 can be positioned either in close proximity to computer system 118, or further away from computer system 118. In some embodiments, better sensitivity and, hence, higher signal-to-noise ratio (SNR) is achieved by placing antenna 122, antenna 124, and antenna 126 closer to computer system 118, in a specified orientation and/or near specific components or areas of computer system 118.

In some embodiments, antenna 122, antenna 124, and antenna 126 are held in a fixed orientation with respect to each other. In some embodiments, antenna 122, antenna 124, and antenna 126 are held in a fixed orientation with respect to computer system 118 or the component in computer system 118 from which the electromagnetic radiation is to be detected. In some embodiments, antenna 122, antenna 124, and antenna 126 are physically attached to each other. In some embodiments, antenna 122, antenna 124, and antenna 126 are physically attached to a portion of computer system 118 or a component inside computer system 118. For example, in some embodiments, antenna 122, antenna 124, and antenna 126 are physically attached to a printed circuit board in computer system 118 in a fixed orientation with respect to each other and to the source of the electromagnetic signals to be detected. In some embodiments, antenna 122, antenna 124, and antenna 126 are integrated into a component, or printed circuit board in computer system 118. In some embodiments, antenna 122, antenna 124, and antenna 126 are disposed on a circuit board in computer system 118 and/or a circuit board in computer system 118 includes antenna 122, antenna 124, and antenna 126 as discussed in pending U.S. patent application Ser. No. 12/132,878, entitled "Computer system with Integrated Electromagnetic-Interference Detectors," by Steven F. Zwinger, Kenny C. Gross, and Aleksey M. Urmanov, and filed 4 Jun. 2008, which is hereby fully incorporated by reference.

The electromagnetic signals detected by antenna 122, antenna 124, and antenna 126 can be used to characterize any parameter of a computer system including but not limited to any one or more of the following parameters for one or more components in the computer system or the computer system as a whole: model or manufacturer; authenticity; the presence and length of metal whiskers; a physical variable; a fault; a prognostic variable; a health metric; or any other parameter that affects an electromagnetic signal radiated from a computer system. The use of electromagnetic signals to characterize parameters of a computer system is discussed in the following: U.S. Pat. No. 7,613,576, entitled "Using EMI Signals to Facilitate Proactive Fault Monitoring in Computer Systems," by Kenny C. Gross, Aleksey M. Urmanov, Ramakrishna C. Dhanekula and Steven F. Zwinger, and filed 12 Apr. 2007, which is hereby fully incorporated by reference; U.S. Pat. No. 7,613,580, entitled "Method and Apparatus for Generating an EMI Fingerprint for a Computer System," by Kenny C. Gross, Aleksey M. Urmanov, and Ramakrishna C. Dhanekula, and filed 12 Apr. 2007, which is hereby fully incorporated by reference; pending U.S. patent application Ser. No. 12/001,369, entitled "Accurately Inferring Physical Variable Values Associated with Operation of a Computer System," by Ramakrishna C. Dhanekula , Kenny C. Gross, and Aleksey M. Urmanov, and filed 10 Dec. 2007, which is hereby fully incorporated by reference; pending U.S. patent application Ser. No. 11/985,288, entitled "Proactive Detection of Metal Whiskers in Computer Systems," by Ramakrishna C. Dhanekula, Kenny C. Gross, and David K. McElfresh, and filed 13 Nov. 2007, which is hereby fully incorporated by reference; pending U.S. patent application Ser. No. 11/974,788, entitled "Detecting Counterfeit Electronic Components Using EMI Telemetric Fingerprints," by Kenny C. Gross, Ramakrishna C. Dhanekula, and Andrew J. Lewis, and filed 16 Oct. 2007, which is hereby fully incorporated by reference; and pending U.S. patent application Ser. No. 12/126,612, entitled "Determining a Total Length for Conductive Whiskers in Computer Systems," by David K. McElfresh, Kenny C. Gross, and Ramakrishna C. Dhanekula, and filed 23 May 2008, which is hereby fully incorporated by reference.

In some embodiments of the present invention, execution mechanism 102 causes load script 116 to be executed by computer system 118 during a computer-system-parameter-detection process. Note that the computer-system-parameter-detection process can be performed in parallel with normal computer system operation. In some embodiments of the present invention, execution mechanism 102 is only used during the training phase of the computer-system-parameter-detection process. Hence, execution mechanism 102 is idle during the monitoring phase of the computer-system-parameter-detection process. In other embodiments, execution mechanism 102 causes load script 116 to be executed by computer system 118 during the training phase. Then, during the computer-system-parameter-detection process, normal computer system operation is interrupted and execution mechanism 102 causes load script 116 to be executed by computer system 118. In some embodiments of the present invention, load script 116 is stored on computer system 118.

In some embodiments of the present invention, load script 116 can include: a sequence of instructions that produces a load profile that oscillates between specified processor utilization percentages for a processor in computer system 118; and/or a sequence of instructions that produces a customized load profile. In some embodiments of the present invention, load script 116 is a dynamic load script which changes the load on the processor as a function of time.

In some embodiments of the present invention, during the computer-system-parameter-detection process, the electromagnetic signal generated within one or more circuits in target area 120 is collected by antenna 122, antenna 124, and antenna 126. It is noted that the electromagnetic signal can be comprised of a set of one or more electromagnetic signals.

The target electromagnetic signal from each antenna is received by frequency-analysis mechanism 104, which then transforms each of the collected electromagnetic signal time-series to the frequency-domain. In some embodiments of the present invention, one or more of the received target electromagnetic signals are amplified prior to being transformed into the frequency domain. In some embodiments of the present invention, frequency-analysis mechanism 104 can include a spectrum analyzer.

Frequency-analysis mechanism 104 is coupled to fingerprint-generation mechanism 106. In some embodiments of the present invention, fingerprint-generation mechanism 106 is configured to generate a separate electromagnetic-signal fingerprint based on the frequency-domain representation of the electromagnetic signal received by each electromagnetic signal. This process is described in more detail below in conjunction with FIG. 3.

As illustrated in FIG. 1, the output of fingerprint-generation mechanism 106 is coupled to the inputs of both pattern-recognition module 108 and fingerprint-comparison mechanism 110. In some embodiments of the present invention, pattern-recognition module 108 performs at least two functions. First, pattern-recognition module 108 builds a separate pattern-recognition model for the electromagnetic signal received from target area 120 by each antenna. The pattern-recognition models estimate the electromagnetic-signal fingerprint associated with the electromagnetic signal received from target area 120 for each of the 3 antennas. Second, pattern-recognition module 108 can use each pattern-recognition model to compute estimates of the electromagnetic-signal fingerprint associated with the electromagnetic-signal received from target area 120 by each antenna. This operation of pattern-recognition module 108 is described in more detail below in conjunction with FIGS. 5 and 6.

For the electromagnetic signal received by each of the 3 antennas, fingerprint-comparison mechanism 110 compares the electromagnetic-signal fingerprint generated by fingerprint-generation mechanism 106 to an estimated electromagnetic-signal fingerprint computed by the pattern-recognition model. The comparison operation performed by fingerprint-comparison mechanism 110 is described in more detail below in conjunction with FIG. 6. Alarm-generation mechanism 112 is configured to generate an alarm based on the comparison results from fingerprint-comparison mechanism 110. In some embodiments, information related to the generated alarms is used to characterize information related to the parameter of computer system 118. The information related to the parameter of the computer system can include but is not limited to any of the parameters discussed in the U.S. patent applications referenced above.

In some embodiments, detection module 100 also includes a performance-parameter-monitoring mechanism that monitors performance parameters of computer system 118. In some embodiments, the performance-parameter-monitoring mechanism includes an apparatus for monitoring and recording computer system performance parameters as set forth in U.S. Pat. No. 7,020,802, entitled "Method and Apparatus for Monitoring and Recording Computer System Performance Parameters," by Kenny C. Gross and Larry G. Votta, Jr., issued on 28 Mar. 2006, which is hereby fully incorporated by reference. The performance-parameter-monitoring mechanism monitors the performance parameters of computer system 118 and sends information related to the monitored performance parameters to frequency-analysis mechanism 104. In these embodiments, information related to the monitored performance parameters are built into the pattern-recognition models, the generated fingerprints and the estimated fingerprints resulting from the electromagnetic signal received from each of the 3 antennas.

Figure 2:
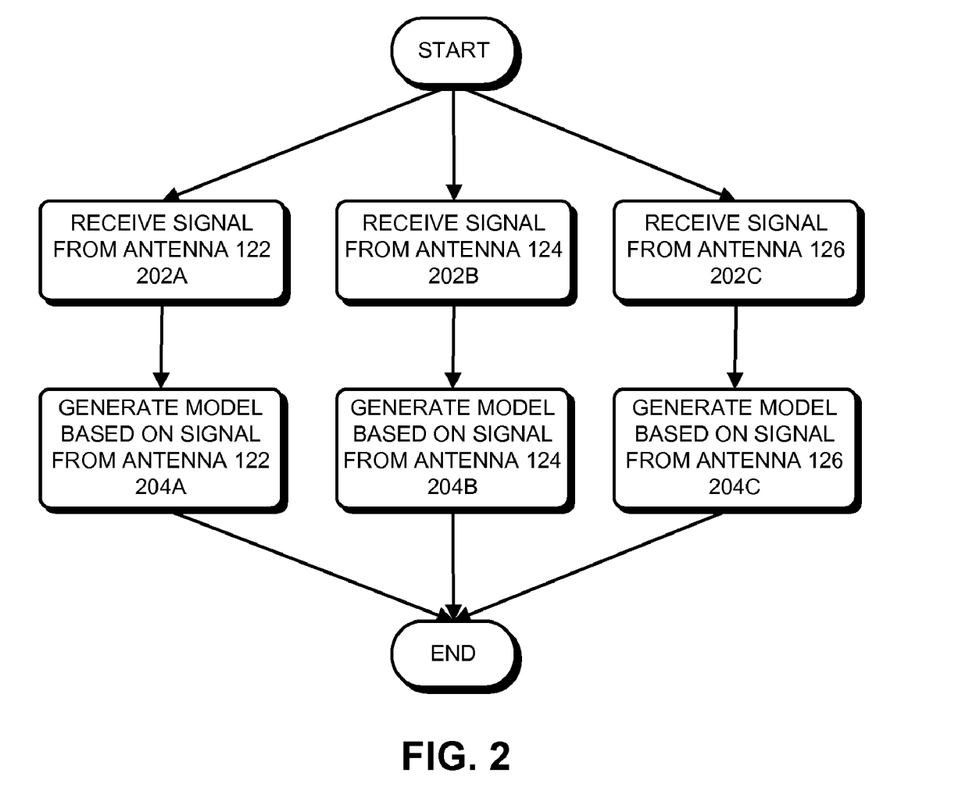
FIG. 2 presents a flowchart illustrating the process of building a separate pattern recognition model for the signal received by each antenna in accordance with some embodiments of the present invention.

In some embodiments of the present invention, prior to characterizing the parameter of computer system 118, detection module 100 builds 3 pattern-recognition models, wherein each model is based on the electromagnetic signals collected from computer system 100 by a separate one of the 3 antennas. FIG. 2 presents a flowchart illustrating the process of building a separate pattern-recognition model for the signal received by each antenna in accordance with some embodiments of the present invention. Referring to FIG. 2, the electromagnetic signal is received by antenna 122 (step 202A) and a pattern-recognition model is generated based on the signal received by antenna 122 (step 204A). The electromagnetic signal is received by antenna 124 (step 202B) and a pattern-recognition model is generated based on the signal received by antenna 124 (step 204B). The electromagnetic signal is received by antenna 126 (step 202C) and a pattern-recognition model is generated based on the signal received by antenna 126 (step 204C).

Figure 3:
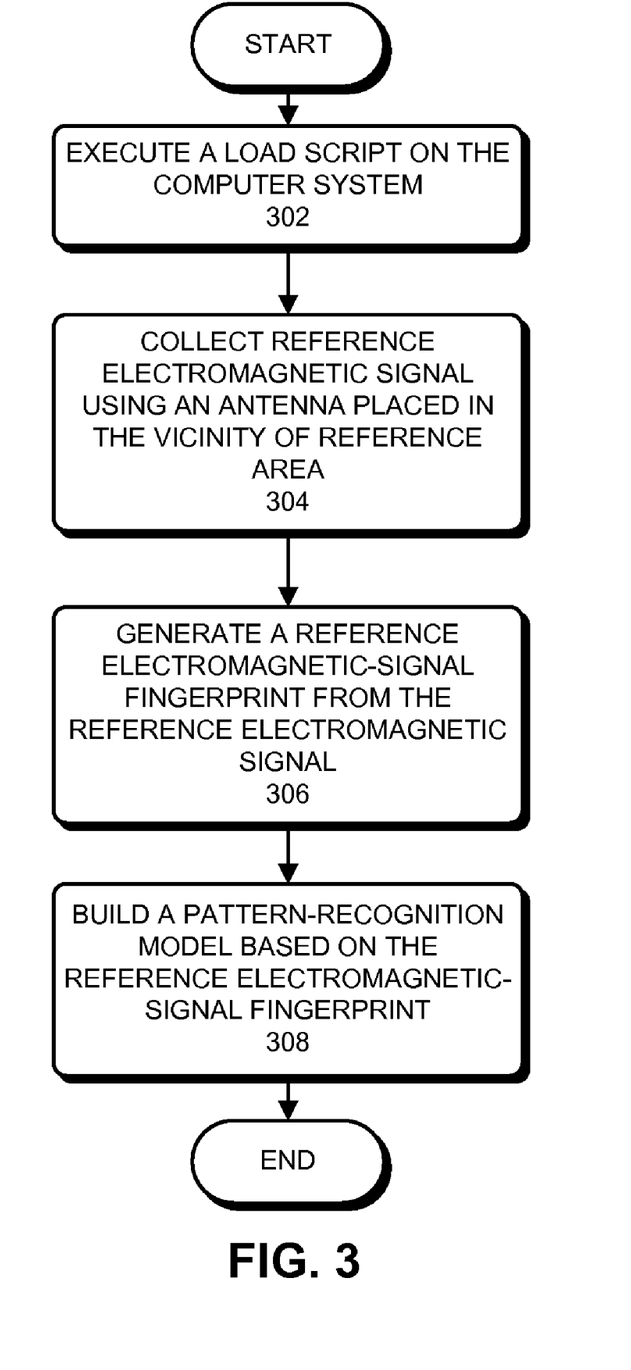
FIG. 3 presents a flowchart illustrating the process of building a pattern recognition model in accordance with some embodiments of the present invention.

FIG. 3 presents a flowchart illustrating the process of building a pattern-recognition model in accordance with some embodiments of the present invention.

During operation, the detection module executes a load script on computer system, wherein the load script includes a specified sequence of operations (step 302). In some embodiments of the present invention, the load script is a dynamic load script which changes the load on a processor in the computer system as a function of time. While executing the load script, the detection module collects a reference electromagnetic signal time-series using one of the antennas placed in the vicinity of a reference area within the computer system (step 304). In some embodiments of the present invention, the reference area is the target area when the target area is in a known state. For example, the reference electromagnetic signal can be collected when the computer system is first deployed in the field and the parameter of the computer system is in a known state. In another embodiment, the reference electromagnetic signal can be collected from the reference area after the reference area has been analyzed and the parameter of the computer system is determined to be in a predetermined state.

Next, the system generates a reference electromagnetic-signal fingerprint from the reference electromagnetic signal (step 306). We describe the process of generating the reference electromagnetic-signal fingerprint below in conjunction with FIG. 4. The system next builds the pattern-recognition model based on the reference electromagnetic-signal fingerprint (step 308). Note that step 308 can be performed by pattern-recognition mechanism 108 in FIG. 1. We describe step 308 further below after we provide more details of generating the reference electromagnetic-signal fingerprint.

Figure 4:
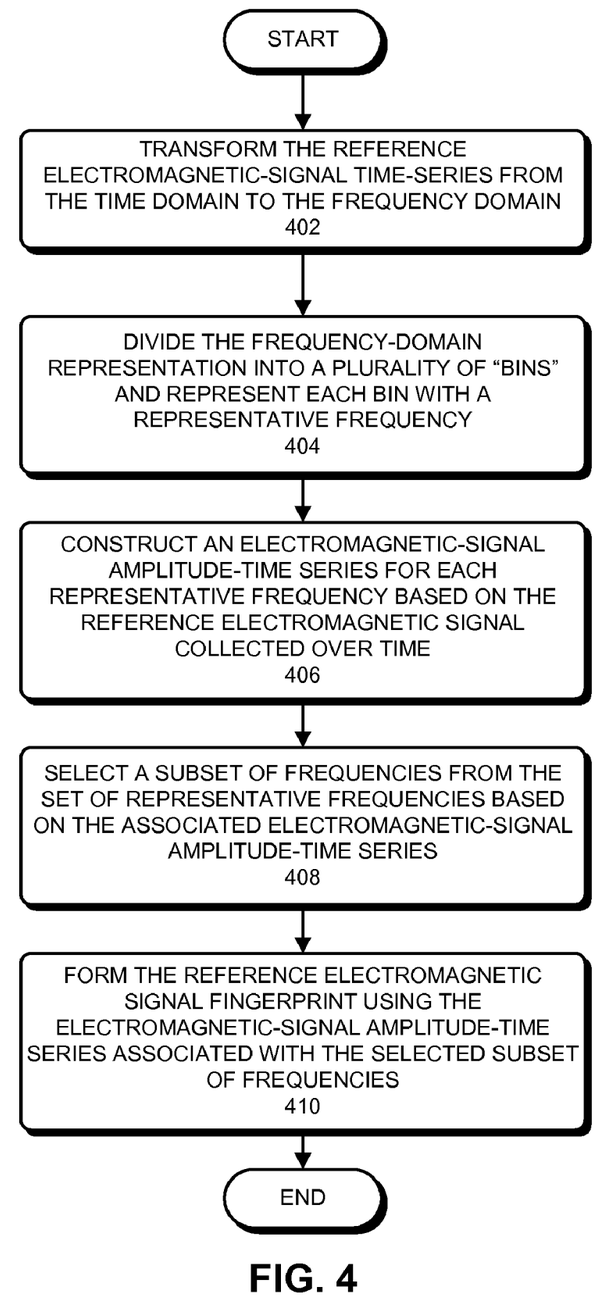
FIG. 4 presents a flowchart illustrating the process of generating the reference electromagnetic-signal fingerprint from the reference electromagnetic signal in accordance with some embodiments of the present invention.

FIG. 4 presents a flowchart illustrating the process of generating the reference electromagnetic-signal fingerprint from the reference electromagnetic signal in accordance with some embodiments of the present invention.

During operation, the system starts by transforming the electromagnetic-signal time-series from the time domain to the frequency domain (step 402). In some embodiments of the present invention, transforming the electromagnetic-signal time-series from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

The system then divides the frequency range associated with the frequency-domain representation of the reference electromagnetic signal into a plurality of "bins," and represents each discrete bin with a representative frequency (step 404). For example, one can divide the frequency range into about 600 bins. In some embodiments, these frequency bins and the associated frequencies are equally spaced.

Next, for each of the plurality of representative frequencies, the system constructs an electromagnetic-signal amplitude-time series based on the reference electromagnetic-signal time series collected over a predetermined time period (step 406). In some embodiments, to generate the time series for each frequency, the electromagnetic signal is sampled at predetermined time intervals, for example once every second or every minute. Next, each of the sampled electromagnetic signal intervals is transformed into the frequency domain, and an electromagnetic-signal amplitude-time pair is subsequently extracted for each of the representative frequencies at each time interval. In this way, the system generates a large number of separate electromagnetic-signal amplitude-time series for the plurality of frequencies.

The system next selects a subset of frequencies from the plurality of frequencies based on the associated electromagnetic-signal amplitude-time series (step 408). It is noted that in some embodiments, a subset of frequencies is not selected and the system uses all of the available frequencies. In some embodiments, selecting the subset of frequencies optimizes detection sensitivity while minimizing computation costs.

Figure 5:
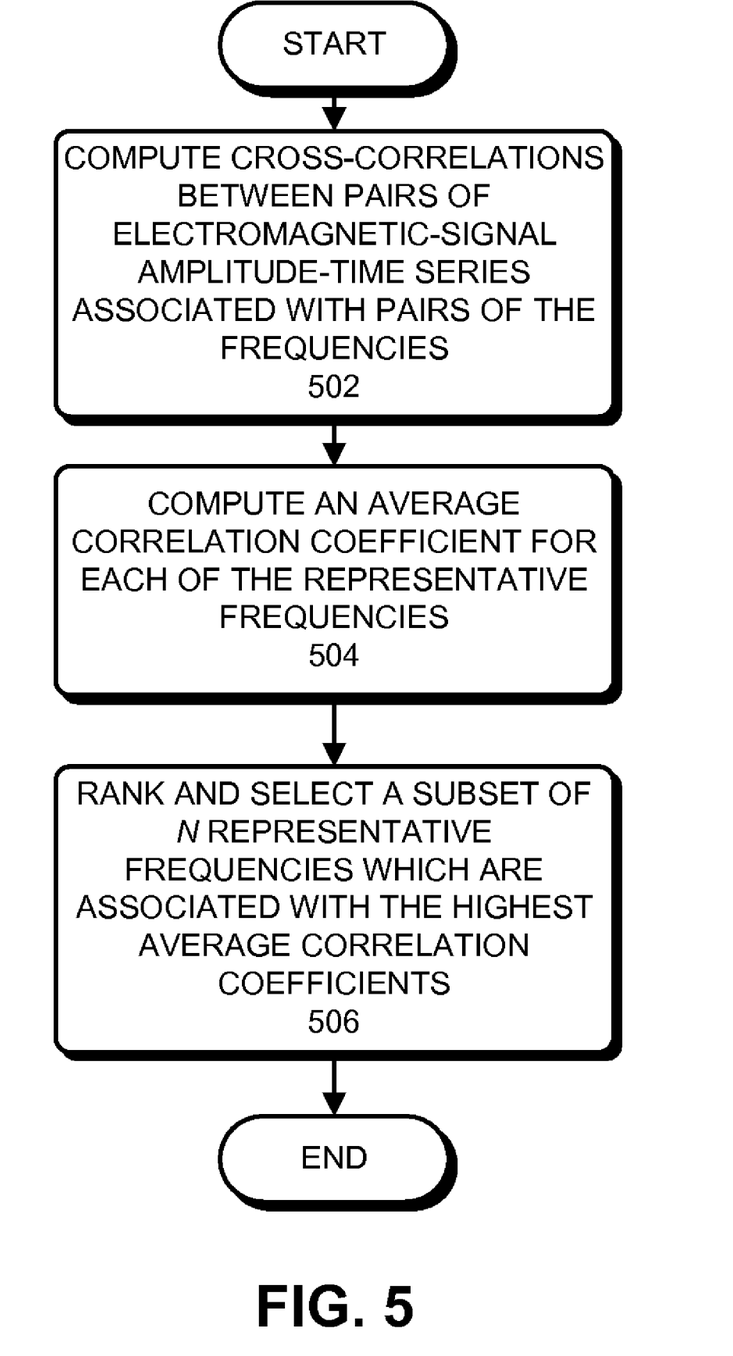
FIG. 5 presents a flowchart illustrating the process of selecting the subset of frequencies based on the correlations between the set of electromagnetic-signal amplitude-time series in accordance with some embodiments of the present invention.

FIG. 5 presents a flowchart illustrating the process of selecting the subset of frequencies based on the correlations between the set of electromagnetic-signal amplitude-time series in accordance with some embodiments of the present invention. During operation, the system computes cross-correlations between pairs of electromagnetic-signal amplitude-time series associated with pairs of the representative frequencies (step 502). Next, the system computes an average correlation coefficient for each of the plurality of representative frequencies (step 504). The system then ranks and selects a subset of N representative frequencies which are associated with the highest average correlation coefficients (step 506). Note that the electromagnetic-signal amplitude-time series associated with these N frequencies are the most highly correlated with other amplitude-time series. In some embodiments of the present invention, N is typically less than or equal to 20.

Referring back to FIG. 4, when the subset of frequencies has been selected, the system forms the reference electromagnetic-signal fingerprint using the electromagnetic-signal amplitude-time series associated with the selected frequencies (step 410).

Referring back to step 308 in FIG. 3, note that when the reference electromagnetic-signal fingerprint is generated, the system uses the set of N electromagnetic-signal amplitude-time series associated with the selected frequencies as training data to train the pattern-recognition model. In some embodiments of the present invention, the pattern-recognition model is a non-linear, non-parametric (NLNP) regression model. In some embodiments, the NLNP regression technique includes a multivariate state estimation technique (MSET). The term "MSET" as used in this specification refers to a class of pattern-recognition algorithms. For example, see [Gribok] "Use of Kernel Based Techniques for Sensor Validation in Nuclear Power Plants," by Andrei V. Gribok, J. Wesley Hines, and Robert E. Uhrig, *The Third American Nuclear Society International Topical Meeting on Nuclear Plant Instrumentation and Control and Human-Machine Interface Technologies*, Washington D.C., Nov. 13-17, 2000. This paper outlines several different pattern recognition approaches. Hence, the term "MSET" as used in this specification can refer to (among other things) any technique outlined in [Gribok], including Ordinary Least Squares (OLS), Support Vector Machines (SVM), Artificial Neural Networks (ANNs), MSET, or Regularized MSET (RMSET).

During this model training process, an NLNP regression model receives the set of electromagnetic-signal amplitude-time series (i.e., the reference electromagnetic-signal fingerprint) as inputs (i.e., training data), and learns the patterns of interaction between the set of N electromagnetic-signal amplitude-time series. Consequently, when the training is complete, the NLNP regression model is configured and ready to perform model estimates for the same set of N electromagnetic-signal amplitude-time series.

Figure 6:
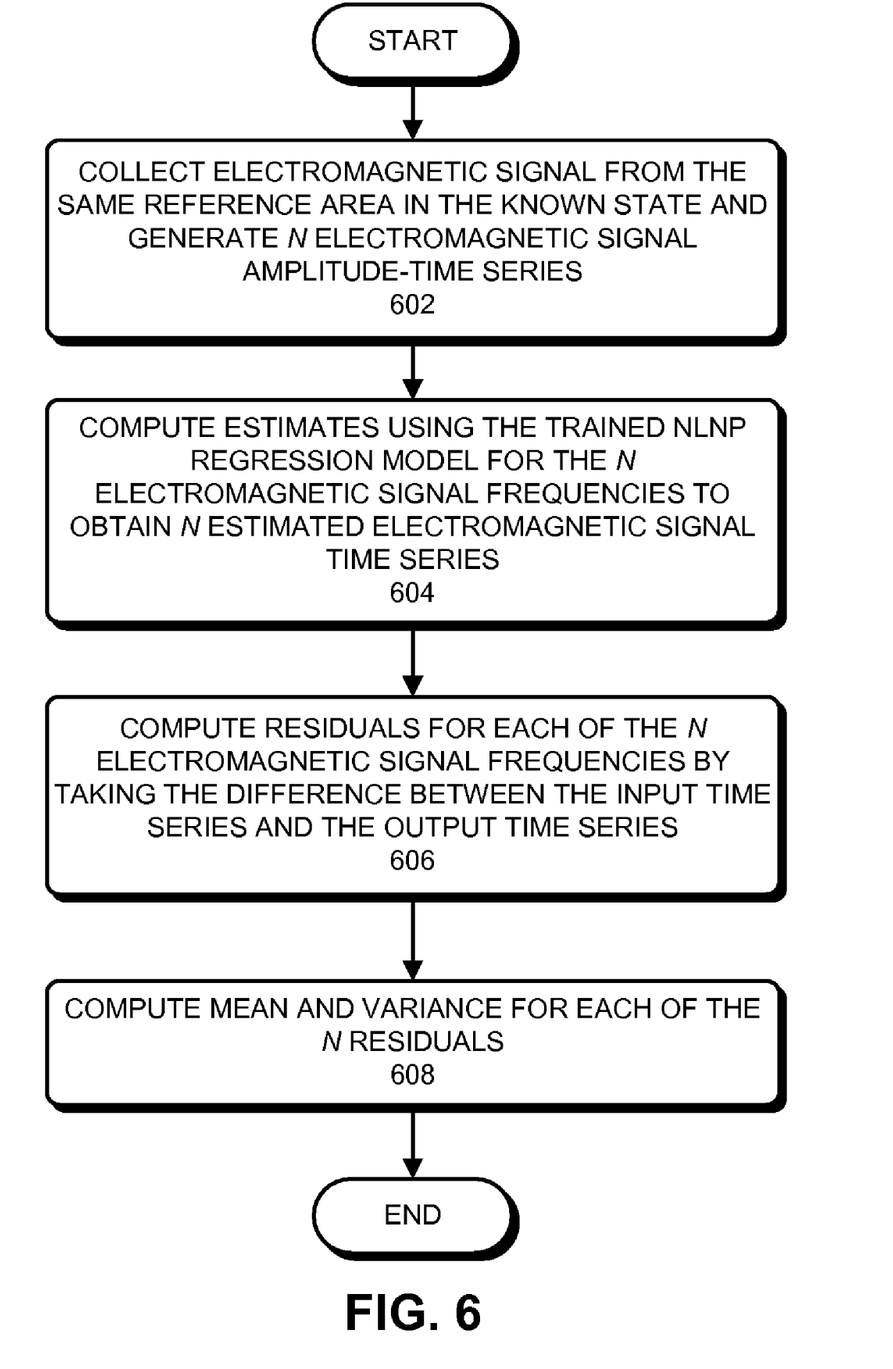
FIG. 6 presents a flowchart illustrating the process of computing mean and variance of residuals for the model estimates in accordance with some embodiments of the present invention.

In some embodiments of the present invention, when the NLNP regression model is built, it is subsequently used to compute mean and variance of residuals associated with the model estimates. Note that these mean and variance values will be used during the monitoring process as described below. Specifically, FIG. 6 presents a flowchart illustrating the process of computing mean and variance of residuals for the model estimates in accordance with some embodiments of the present invention.

During operation, the system receives an electromagnetic signal from one of the antennas and generates the same set of N electromagnetic-signal amplitude-time series in a process as described above (step 602). The system then computes estimates using the trained NLNP regression model for the set of N electromagnetic signal frequencies (step 604) wherein the regression model was trained using the signals received from the same antenna. Specifically, the NLNP regression model receives the set of N electromagnetic-signal amplitude-time series as inputs and produces a corresponding set of N estimated electromagnetic-signal amplitude-time series as outputs. Next, the system computes the residuals for each of the N electromagnetic signal frequencies by taking the difference between the corresponding input time series and the output time series (step 606). Hence, the system obtains N residuals. The system then computes mean and variance for each of the N residuals (step 608).

Figure 7:
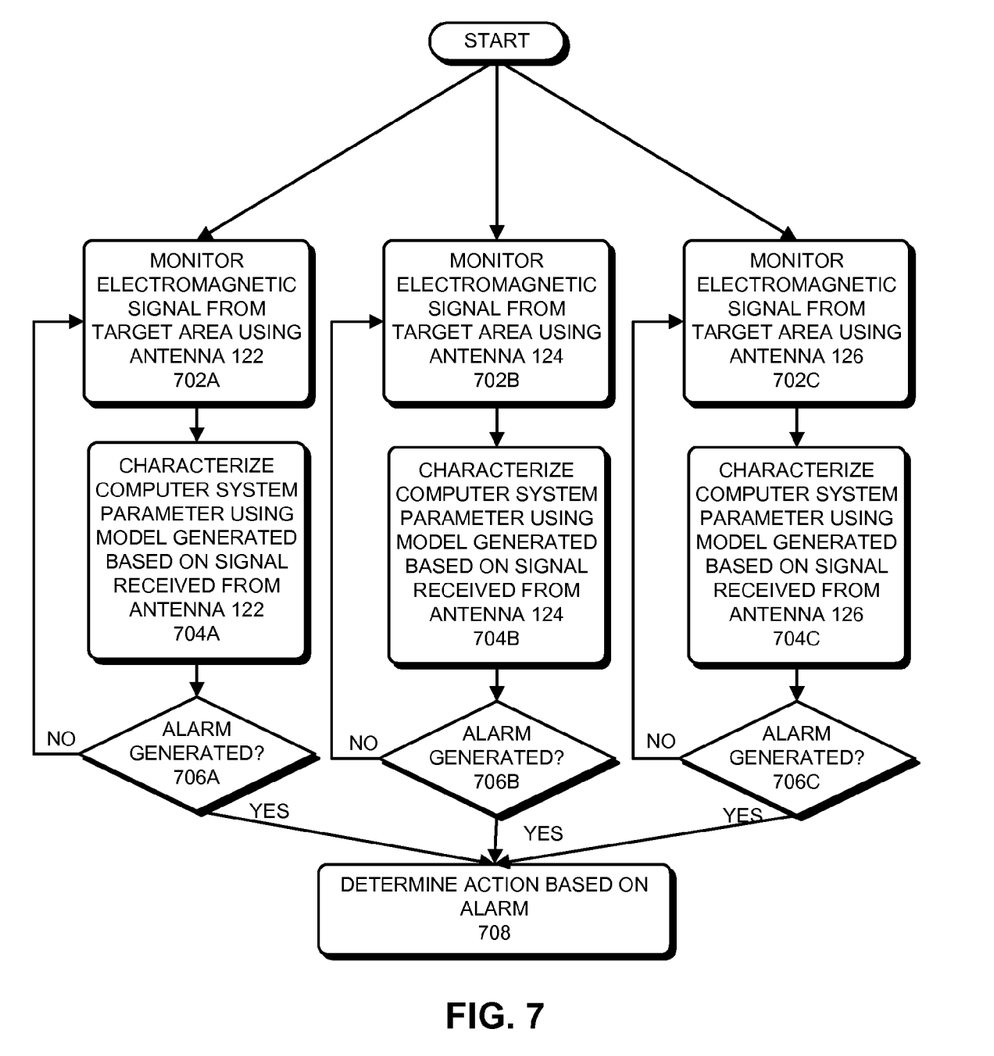
FIG. 7 presents a flowchart illustrating the process of monitoring an electromagnetic signal to characterize a computer system parameter by analyzing a target electromagnetic signal radiating from the computer system and received by 3 antennas in accordance with some embodiments of the present invention.

FIG. 7 presents a flowchart illustrating the process of monitoring an electromagnetic signal to characterize a computer system parameter by analyzing a target electromagnetic signal radiating from the computer system and received by 3 antennas in accordance with some embodiments of the present invention. The electromagnetic signal radiating from the target area is monitored using antenna 122 (step 702A). The computer system parameter is then characterized using the model generated based on the electromagnetic signal received from antenna 122 as depicted in step 204A (step 704A). If an alarm is generated (step 706A), then the action that is taken is determined based on the alarm generated (step 708). If no alarm is generated then the process returns to step 702A. The electromagnetic signal radiating from the target area is also monitored using antenna 124 (step 702B). The computer system parameter is then characterized using the model generated based on the electromagnetic signal received from antenna 124 as depicted in step 204B (step 704B). If an alarm is generated (step 706B), then the action that is taken is determined based on the alarm generated (step 708). If no alarm is generated then the process returns to step 702B. The electromagnetic signal radiating from the target area is also monitored using antenna 126 (step 702C). The computer system parameter is then characterized using the model generated based on the electromagnetic signal received from antenna 126 as depicted in step 204C (step 704C). If an alarm is generated (step 706C), then the action that is taken is determined based on the alarm generated (step 708). If no alarm is generated then the process returns to step 702C. The step of characterizing the computer system parameter using a model based on the received signal and generating an alarm is discussed in more detail below with respect to FIGS. 8A and 8B.

Figure 8A:
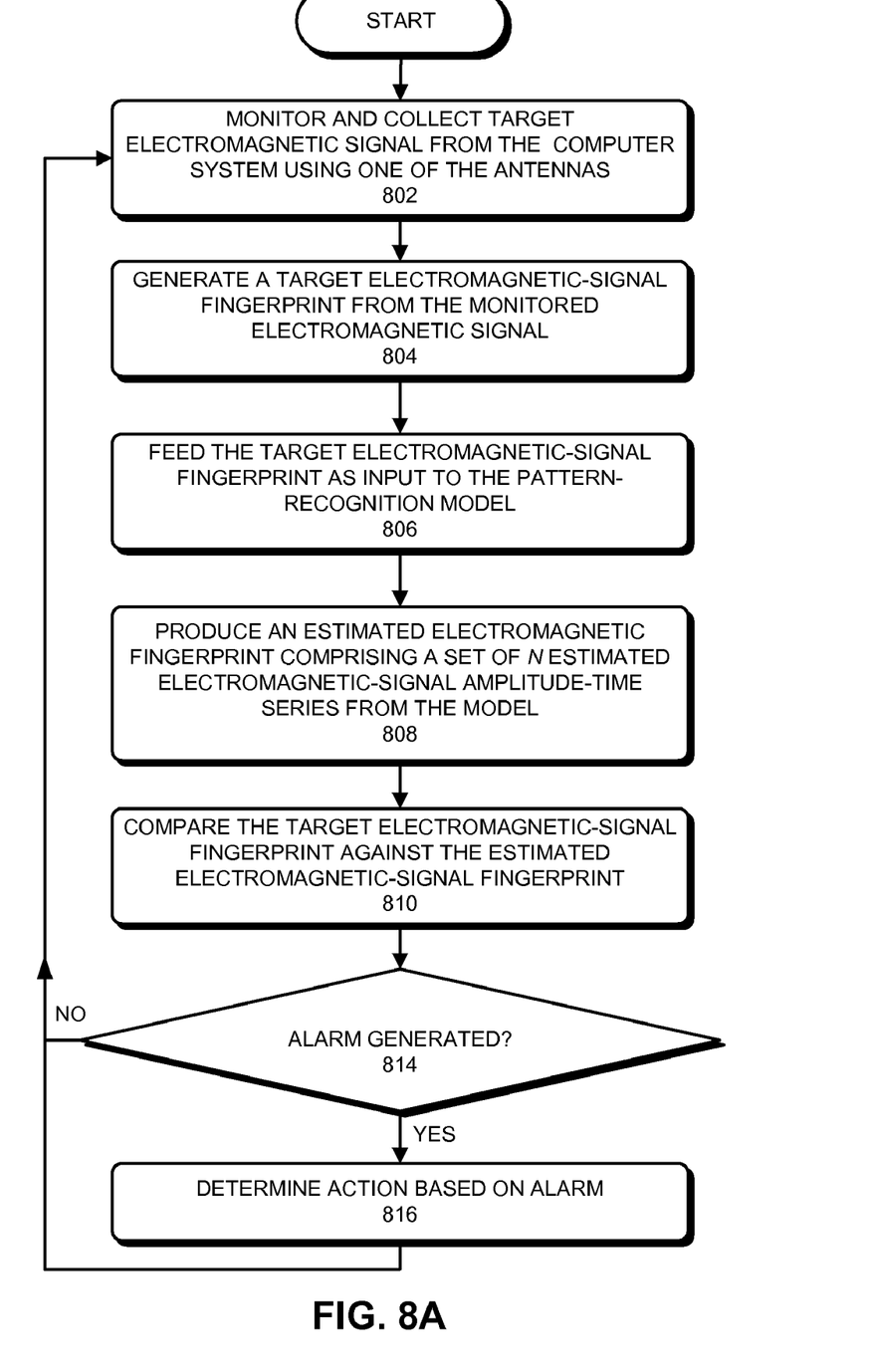
FIGS. 8A and 8B present flowcharts illustrating the process of monitoring an electromagnetic signal to characterize a computer system parameter by analyzing a target electromagnetic signal radiating from the computer system and received by an antenna in accordance with some embodiments of the present invention.
Figure 8B:
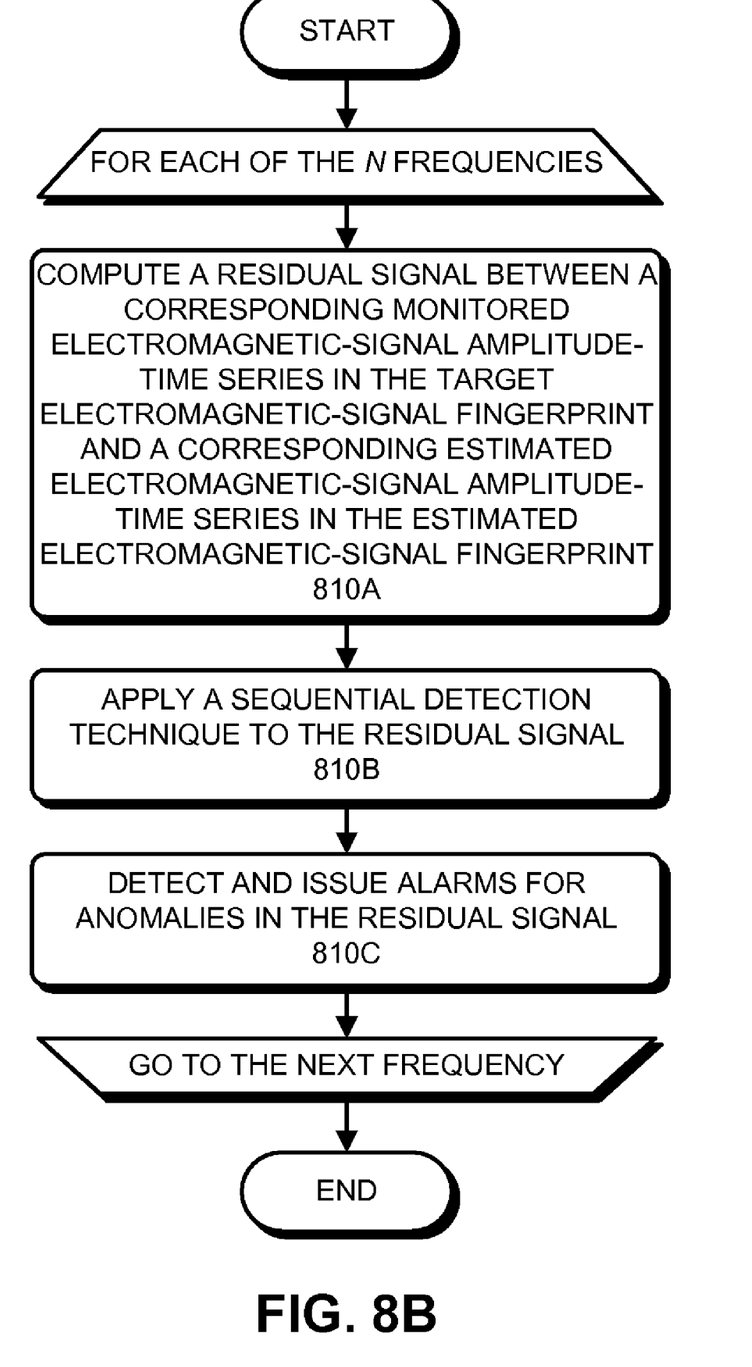

FIGS. 8A and 8B present flowcharts illustrating the process of monitoring an electromagnetic signal to characterize a computer system parameter by analyzing a target electromagnetic signal radiating from the computer system and received by an antenna in accordance with some embodiments of the present invention. During a monitoring operation, the system monitors and collects an electromagnetic signal from the target area in the computer system using one of the antennas (step 802). In some embodiments of the present invention, the computer system is performing routine operations during the monitoring process; hence, the computer system may be executing any workload during this process. In other embodiments, the computer system executes a load script during the monitoring process.

The system then generates a target electromagnetic-signal fingerprint from the monitored electromagnetic signal (step 804). Note that the target electromagnetic-signal fingerprint can be generated from the electromagnetic signal in a similar manner to generating the reference electromagnetic-signal fingerprint as described in conjunction with FIG. 4. In some embodiments of the present invention, the system generates the target electromagnetic signal fingerprint by: (1) transforming the monitored electromagnetic-signal time-series from the time-domain to the frequency-domain; (2) for each of the set of N frequencies in the reference electromagnetic-signal fingerprint, generating a monitored electromagnetic-signal amplitude-time series based on the frequency-domain representation of the monitored electromagnetic-signal collected over time; and (3) forming the target electromagnetic-signal fingerprint using the set of N monitored electromagnetic-signal amplitude-time series associated with the selected N frequencies. In some embodiments of the present invention, the target electromagnetic-signal fingerprint comprises all the N frequencies as the reference electromagnetic-signal fingerprint. In a further embodiment, the target electromagnetic-signal fingerprint comprises a subset of the N frequencies in the reference electromagnetic-signal fingerprint.

Next, the system feeds the target electromagnetic-signal fingerprint as input to the pattern-recognition model which has been trained using the reference electromagnetic-signal fingerprint (step 806), and subsequently produces an estimated electromagnetic-signal fingerprint as output (step 808). In some embodiments of the present invention, the estimated electromagnetic-signal fingerprint comprises a set of N estimated electromagnetic-signal amplitude-time series corresponding to the set of N monitored electromagnetic-signal amplitude-time series in the target electromagnetic-signal fingerprint.

The system then compares the target electromagnetic-signal fingerprint against the estimated electromagnetic-signal fingerprint (step 810). This step is shown in more detail in FIG. 8B. Specifically, for each of the selected N frequencies, the system computes a residual signal between a corresponding monitored electromagnetic-signal amplitude-time series in the target electromagnetic-signal fingerprint and a corresponding estimated electromagnetic-signal amplitude-time series in the estimated electromagnetic-signal fingerprint (step 810A). The system then applies a sequential detection technique to the residual signal (step 810B). In some embodiments of the present invention, the sequential detection technique is a Sequential Probability Ratio Test (SPRT). In some embodiments of the present invention, the SPRT uses the mean and variance computed for the corresponding residual signal during the model training process to detect anomalies in the residual signal, wherein the anomalies indicate a deviation of the monitored electromagnetic-signal amplitude-time series from the estimated electromagnetic-signal amplitude-time series. Note that when such anomalies are detected in the residual signal, SPRT alarms are subsequently issued (step 810C).

Referring back to FIG. 8A, the system next determines if anomalies are detected in at least one of the N monitored electromagnetic-signal amplitude-time series, for example, based on the SPRT alarms. If an alarm is not generated (step 814), the process returns to step 802. If an alarm is generated then it is determined what action should be taken based on the alarm (step 816).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for characterizing a computer system parameter by analyzing a target electromagnetic signal radiating from the computer system, the method comprising:
monitoring the target electromagnetic signal using a first antenna;
monitoring the target electromagnetic signal using a second antenna, wherein an axis of the second antenna is oriented non-parallel to an axis of the first antenna; and
separately analyzing the target electromagnetic signal received from the first antenna and the target electromagnetic signal received from the second antenna to characterize the computer system parameter.

2. The method of claim 1, wherein the computer system parameter includes a computer system health metric.

3. The method of claim 1, wherein:
the first antenna is orthogonal to the second antenna.

4. The method of claim 3, further comprising:
monitoring the target electromagnetic signal using a third antenna, wherein the third antenna is orthogonal to the first antenna and the second antenna; and
separately analyzing the target electromagnetic signal received from the first antenna, the target electromagnetic signal received from the second antenna, and the target electromagnetic signal received from the third antenna to characterize the computer system parameter.

5. The method of claim 1, wherein prior to monitoring the target electromagnetic signal using the first antenna and the second antenna, the method further comprises:
monitoring a reference electromagnetic signal radiating from the computer system using a first reference antenna;
monitoring the reference electromagnetic signal using a second reference antenna, wherein an axis of the second reference antenna is oriented non-parallel to an axis of the first reference antenna;
generating a first reference model to characterize the computer system parameter based on the reference electromagnetic signal monitored using the first reference antenna; and
generating a second reference model to characterize the computer system parameter based on the reference electromagnetic signal monitored using the second reference antenna.

6. The method of claim 5, wherein at least one of the first reference model and the second reference model uses a pattern-recognition technique.

7. The method of claim 5, wherein at least one of the first reference model and the second reference model uses a multivariate state estimation technique (MSET).

8. The method of claim 5, wherein:
the first reference antenna includes the first antenna; and
the second reference antenna includes the second antenna.

9. The method of claim 5, wherein separately analyzing the target electromagnetic signal received from the first antenna and the target electromagnetic signal received from the second antenna includes:
generating a first target electromagnetic-signal fingerprint from the target electromagnetic signal monitored using the first antenna;
generating a second target electromagnetic-signal fingerprint from the target electromagnetic signal monitored using the second antenna;
feeding the first target electromagnetic-signal fingerprint into the first reference model to characterize the computer system parameter; and
feeding the second target electromagnetic-signal fingerprint into the second reference model to characterize the computer system parameter.

10. The method of claim 9,
wherein feeding the first target electromagnetic-signal fingerprint into the first reference model to characterize the computer system parameter includes producing a first estimated electromagnetic-signal fingerprint using the first reference model;
wherein feeding the second target electromagnetic-signal fingerprint into the second reference model to characterize the computer system parameter includes producing a second estimated electromagnetic-signal fingerprint using the second reference model;
wherein separately analyzing the target electromagnetic signal received from the first antenna and the target electromagnetic signal received from the second antenna to characterize the computer system parameter includes:
comparing the first target electromagnetic-signal fingerprint to the first estimated electromagnetic fingerprint to characterize the computer system parameter; and
comparing the second target electromagnetic-signal fingerprint to the second estimated electromagnetic fingerprint to characterize the computer system parameter.

11. The method of claim 10, wherein comparing the first target electromagnetic-signal fingerprint to the first estimated electromagnetic fingerprint includes:
for each frequency in a set of frequencies from a frequency-domain representation of the first reference electromagnetic signal,
computing a first residual signal between a corresponding first monitored electromagnetic-signal amplitude-time series in the first target electromagnetic-signal fingerprint and a corresponding first estimated electromagnetic-signal amplitude-time series in the first estimated electromagnetic-signal fingerprint;
detecting anomalies in the first residual signal by using sequential detection, wherein the anomalies indicate a deviation of the first monitored electromagnetic-signal amplitude-time series from the first estimated electromagnetic-signal amplitude-time series;
wherein comparing the second target electromagnetic-signal fingerprint to the second estimated electromagnetic fingerprint includes:
for each frequency in a set of frequencies from a frequency-domain representation of the second reference electromagnetic signal,
computing a second residual signal between a corresponding second monitored electromagnetic-signal amplitude-time series in the second target electromagnetic-signal fingerprint and a corresponding second estimated electromagnetic-signal amplitude-time series in the second estimated electromagnetic-signal fingerprint;
detecting anomalies in the second residual signal by using sequential detection, wherein the anomalies indicate a deviation of the second monitored electromagnetic-signal amplitude-time series from the second estimated electromagnetic-signal amplitude-time series; and
wherein characterizing the computer system parameter includes detecting anomalies in at least one of the first residual signal and the second residual signal.

12. A computer-readable storage medium storing instructions that when executed by a computer cause the computer to perform a method for characterizing a computer system parameter by analyzing a target electromagnetic signal radiating from the computer system, the method comprising:
monitoring the target electromagnetic signal using a first antenna;
monitoring the target electromagnetic signal using a second antenna, wherein an axis of the second antenna is oriented non-parallel to an axis of the first antenna; and
separately analyzing the target electromagnetic signal received from the first antenna and the target electromagnetic signal received from the second antenna to characterize the computer system parameter.

13. The computer-readable storage medium of claim 12, wherein:
the first antenna is orthogonal to the second antenna.

14. The computer-readable storage medium of claim 13, further comprising:
- monitoring the target electromagnetic signal using a third antenna, wherein the third antenna is orthogonal to the first antenna and the second antenna; and
- separately analyzing the target electromagnetic signal received from the first antenna, the target electromagnetic signal received from the second antenna, and the target electromagnetic signal received from the third antenna to characterize the computer system parameter.

15. The computer-readable storage medium of claim 12, wherein prior to monitoring the target electromagnetic signal using the first antenna and the second antenna, the method further comprises:
- monitoring a reference electromagnetic signal radiating from the computer system using a first reference antenna; and
- monitoring the reference electromagnetic signal using a second reference antenna, wherein an axis of the second reference antenna is oriented non-parallel to an axis of the first reference antenna;
- generating a first reference model to characterize the computer system parameter based on the reference electromagnetic signal monitored using the first reference antenna; and
- generating a second reference model to characterize the computer system parameter based on the reference electromagnetic signal monitored using the second reference antenna.

16. The computer-readable storage medium of claim 15, wherein:
- the first reference antenna includes the first antenna; and
- the second reference antenna includes the second antenna.

17. The computer-readable storage medium of claim 15, wherein separately analyzing the target electromagnetic signal received from the first antenna and the target electromagnetic signal received from the second antenna includes:
- generating a first target electromagnetic-signal fingerprint from the target electromagnetic signal monitored using the first antenna;
- generating a second target electromagnetic-signal fingerprint from the target electromagnetic signal monitored using the second antenna;
- feeding the first target electromagnetic-signal fingerprint into the first reference model to characterize the computer system parameter; and
- feeding the second target electromagnetic-signal fingerprint into the second reference model to characterize the computer system parameter.

18. The computer-readable storage medium of claim 17,
- wherein feeding the first target electromagnetic-signal fingerprint into the first reference model to characterize the computer system parameter includes producing a first estimated electromagnetic-signal fingerprint using the first reference model;
- wherein feeding the second target electromagnetic-signal fingerprint into the second reference model to characterize the computer system parameter includes producing a second estimated electromagnetic-signal fingerprint using the second reference model;
- wherein separately analyzing the target electromagnetic signal received from the first antenna and the target electromagnetic signal received from the second antenna to characterize the computer system parameter includes:
  - comparing the first target electromagnetic-signal fingerprint to the first estimated electromagnetic fingerprint to characterize the computer system parameter; and
  - comparing the second target electromagnetic-signal fingerprint to the second estimated electromagnetic fingerprint to characterize the computer system parameter.

19. The computer-readable storage medium of claim 18, wherein comparing the first target electromagnetic-signal fingerprint to the first estimated electromagnetic fingerprint includes:
- for each frequency in a set of frequencies from a frequency-domain representation of the first reference electromagnetic signal,
  - computing a first residual signal between a corresponding first monitored electromagnetic-signal amplitude-time series in the first target electromagnetic-signal fingerprint and a corresponding first estimated electromagnetic-signal amplitude-time series in the first estimated electromagnetic-signal fingerprint;
  - detecting anomalies in the first residual signal by using sequential detection, wherein the anomalies indicate a deviation of the first monitored electromagnetic-signal amplitude-time series from the first estimated electromagnetic-signal amplitude-time series;
- wherein comparing the second target electromagnetic-signal fingerprint to the second estimated electromagnetic fingerprint includes:
  - for each frequency in a set of frequencies from a frequency-domain representation of the second reference electromagnetic signal,
    - computing a second residual signal between a corresponding second monitored electromagnetic-signal amplitude-time series in the second target electromagnetic-signal fingerprint and a corresponding second estimated electromagnetic-signal amplitude-time series in the second estimated electromagnetic-signal fingerprint;
    - detecting anomalies in the second residual signal by using sequential detection, wherein the anomalies indicate a deviation of the second monitored electromagnetic-signal amplitude-time series from the second estimated electromagnetic-signal amplitude-time series; and
- wherein characterizing the computer system parameter includes detecting anomalies in at least one of the first residual signal and the second residual signal.

20. An apparatus that characterizes a computer system parameter by analyzing a target electromagnetic signal radiating from the computer system, the apparatus comprising:
- a monitoring mechanism configured to monitor the target electromagnetic signal using a first antenna and a second antenna, wherein an axis of the second antenna is oriented non-parallel to an axis of the first antenna; and
- an analyzing mechanism configured to separately analyze the target electromagnetic signal received from the first antenna and the target electromagnetic signal received from the second antenna to characterize the computer system parameter.

* * * * *